(12) United States Patent
Schafferer

(10) Patent No.: US 9,444,401 B1
(45) Date of Patent: Sep. 13, 2016

(54) METHODS AND DEVICES FOR THE GENERATION OF HIGH FREQUENCY CLOCK SIGNALS

(71) Applicant: S9ESTRE, LLC, Amesbury, MA (US)

(72) Inventor: Bernd Schafferer, Amesbury, MA (US)

(73) Assignee: S9ESTRE, LLC, Amesbury, MA (US)

( * ) Notice: Subject to any disclaimer, the term of this patent is extended or adjusted under 35 U.S.C. 154(b) by 0 days.

(21) Appl. No.: 14/553,065

(22) Filed: Nov. 25, 2014

Related U.S. Application Data

(60) Provisional application No. 61/921,400, filed on Dec. 27, 2013.

(51) Int. Cl.
  *H03B 5/18* (2006.01)
  *H01L 23/66* (2006.01)
  *H03B 9/14* (2006.01)

(52) U.S. Cl.
  CPC .............. *H03B 5/18* (2013.01); *H03B 5/1841* (2013.01); *H03B 5/1847* (2013.01); *H03B 9/147* (2013.01); *H03B 2200/0024* (2013.01); *H03B 2200/0034* (2013.01)

(58) Field of Classification Search
  CPC ............ H03B 5/18; H03B 2200/0034; H03B 5/1841; H03B 5/1847; H03B 9/147; H03B 2200/0024
  USPC ................................................... 331/107 SL
  See application file for complete search history.

(56) References Cited

U.S. PATENT DOCUMENTS

| | | | |
|---|---|---|---|
| 2,483,183 A | 9/1949 | Cohen | |
| 4,518,931 A * | 5/1985 | Rauscher | H03B 5/1852 331/105 |
| 6,853,260 B1 * | 2/2005 | Hajimiri | H03B 5/26 331/107 DP |
| 8,115,560 B2 * | 2/2012 | Chung | H03B 5/1852 327/117 |
| 8,149,066 B2 * | 4/2012 | Bilionis | H03B 5/1847 331/100 |
| 8,183,943 B2 * | 5/2012 | Cheung | H03B 5/1852 331/107 DP |
| 8,339,211 B2 | 12/2012 | Lu et al. | |
| 2006/0261905 A1 | 11/2006 | Ham et al. | |
| 2014/0294131 A9 | 10/2014 | Hammerschmidt et al. | |

OTHER PUBLICATIONS

Andress, William, et al. "Standing Wave Oscillators Utilizing Wave-Adaptive Tapered Transmission Lines". IEEE J. of Solid State Circuits, vol. 40, No. 3, Mar. 2005, pp. 638-651.
Tousi, Yahya, et al. "A Novel CMOS High-Power Terahertz VCO Based on Coupled Oscillators: Theory and Implementation". IEEE J. of Solid-State Circuits, vol. 47, No. 12, Dec. 2012, pp. 3032-3042.

* cited by examiner

*Primary Examiner* — Richard Tan
(74) *Attorney, Agent, or Firm* — Patterson Thuente Pederson, P.A.

(57) ABSTRACT

Methods and devices for the generation of high frequency clock signals. In a transmission line a signal is reflected back and forward. The electric length of the transmission line determines the frequency of the oscillation. A start signal at the switching device initiates a signals traveling down the transmission line. At the other end of the transmission line the signals is reflected back. At the tapping point along the transmission line, part of the energy of the signal in the transmission line is coupled out to form the feedback signal. The feedback signal activates the switching device. The switching device injects energy into the transmission line and sustains the oscillation on the transmission line. The position of the tapping point on transmission line determines the shape of the feedback signals and can hence be used as a design parameter optimize the performance of the system. High voltage swings in the transmission lines can be used to improve the phase noise or jitter performance of the oscillator.

17 Claims, 11 Drawing Sheets

METHODS AND DEVICES FOR THE GENERATION OF HIGH FREQUENCY CLOCK SIGNALS

RELATED APPLICATION

The present application claims the benefit of U.S. Provisional Application No. 61/921,400 entitled "METHODS AND DEVICES FOR THE GENERATION OF HIGH FREQUENCY CLOCK SIGNALS," filed Dec. 27, 2013, which is incorporated herein by reference in its entirety.

TECHNICAL FIELD

This invention relates to oscillator circuits, and more particularly, to oscillator circuits using transmission lines, including as circuits used in microwave ovens.

BACKGROUND

Embodiments of the invention relate to the generation of high frequency clock signals. Clock signals are used in data sampling systems. Clock signals drive analog to digital (ADC) and digital to analog converter (DAC). The performance of the clock signals limits the performance of the ADC and DAC in their dynamically range and spurious performance. Radio frequency (RF) transmission systems require high quality clock signal for the up and down conversion of the baseband signals to and from the RF frequencies. The quality and accuracy of the clock signals effects the overall system performance. In the case of up and down conversion, inadequate clock signals will have a negative impact on the noise, inter-symbol interference and inter-carrier interference. Another embodiment of the invention is the energy efficient generation of clock signals for digital systems.

There are many know devices for the generation high frequency clock signals. Feedback oscillators or negative resistance oscillator. Hartley, Colpitts, Clapp, delay line, phase-shift oscillators standing wave oscillators and rotary traveling wave oscillators are just a view of the many topologies known today. FIG. 1a shows the basic schematic of a rotary traveling wave oscillator. FIG. 1b shows the active devices used to initiate and sustain oscillation.

SUMMARY OF THE INVENTION

Embodiments of the invention comprise high frequency clock generator circuits or oscillator circuits. Transmission lines, forming a tank circuit, are used to generate a shaped feedback signal to trigger a switching device. To achieve a high performance oscillator, i.e. low phase noise or low jitter, the ratio of the energy oscillating in the tank to the noise energy should be maximized. The energy in the tank can be maximized by using high operating voltage. To withstand high operating voltages, high breakdown switching devices such as GaAs, GaN, SiGe can be used. In the proposed implementation only N-type devices are utilized. N-type devices have better performance parameters as their P-type counterparts. In embodiments, the invention does not comprise cross-coupled circuit structures such as those shown in FIG. 1b. Cross coupled circuits exhibit shoot-through or cross-currents during a transition of the clock signal. Also, the transistors of cross coupled circuits can be simultaneously in an on-state during a transition of the clock signal which negatively effects the rise and fall times of the clock signal. With the present invention the gate and drain waveforms of the transistors can be shaped such that the cross-currents and therefore the losses over the transistors are minimal. At the same time, high peak power and stress conditions on the transistors are avoided.

BRIEF DESCRIPTION OF THE DRAWINGS

Embodiments of the invention can be more completely understood in consideration of the following detailed description of various embodiments of the invention in connection with the accompanying drawings, in which.

Figure 1A:
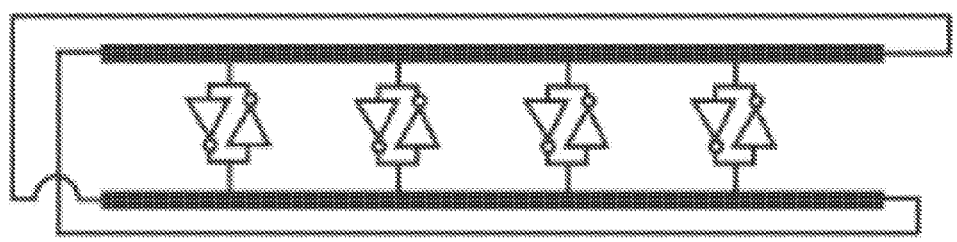
FIG. 1a is a schematic diagram of a rotary traveling wave oscillator.
Figure 1B:
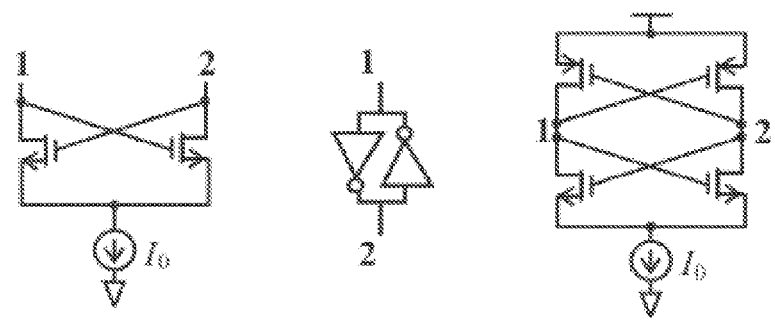
FIG. 1b depicts active circuitry to sustain oscillation.

While embodiments are amenable to various modifications and alternative forms, specifics thereof have been shown by way of example in the drawings and will be described in detail. It should be understood, however, that the intention is not to be limited to the particular embodiments described. On the contrary, the intention is to cover all modifications, equivalents, and alternatives falling within the spirit and scope of the appended claims.

DETAILED DESCRIPTION OF THE DRAWINGS

Figure 2:
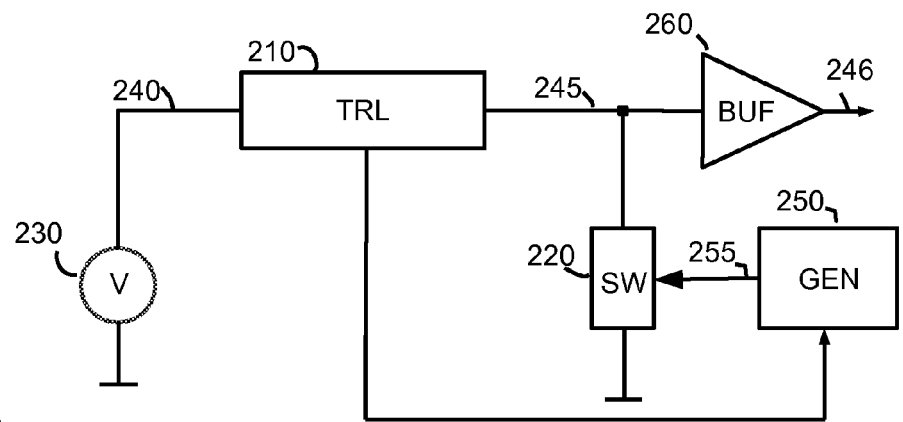
FIG. 2 is a schematic diagram of a transmission line oscillator, according to an embodiment.

FIG. 2 depicts the basic implementation of the oscillator. A tapped transmission line 210 forms a tank circuit. The transmission line has a electric length or delay, such that the time it takes for a signal to travel from one end to the other is roughly one quarter of the period of oscillation. One end of the tapped transmission line 210 is connected to voltage source 230. A switching device 220 is connected to the other end of the transmission line. The switching device is responsive to a signal 255 on the control input of the switching device. A pulse on signal 255 can cause the switching device to pull node 245 towards ground and hence generate a signal on node 245 which will travel down the transmission line to node 240. Node 240 is a low impedance node, this causes the signal to be reflected back to node 245. However, the polarity of the signal will change due to the reflection on the low impedance node 240. Node 245 is a high impedance node, if the switching device 220 is not activated. The signal gets reflected back to node 240. The reflection on high impedance node 245 will not cause a change in polarity. Node 240 will then, again, change the polarity of signal and reflect the signal back to node 245. At the time the signal arrives at node 245 it has the same phase as at the time it was generated one period earlier. The generator 250 can now activate the switching device 220. When the switching device is closed, energy is injected into the tank. The switching device 220 in combination with the voltage source 230 act as an energy restoring device. Once a steady state is reached, the energy injected into the tank is related to the losses in the transmission line and difference between the period of generator signal 255 and the period of the tank signal. The generator 250 can monitor the state of the tank in order to generate signal 255. In the simplest case, the generator 250 is just a delay element taking the voltage from a point on the tapped transmission line 210 and feeding it back to the switching device 220.

Figure 3A:
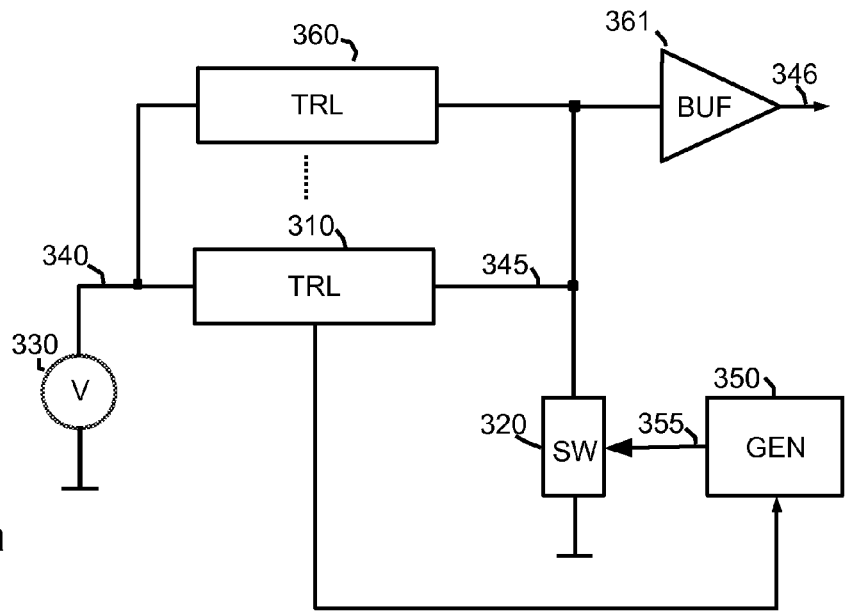
FIG. 3a is a schematic diagram of multiple transmission line oscillators, according to an embodiment.

In operation, the energy in the tank is proportion to the square of the voltage provided by voltage source 230 and inverse proportional to the characteristic impedance of the tapped transmission line 210. In order to increase the energy in the tanks multiple transmission 310, 360 can be used in parallel as shown in FIG. 3a. Only one of the transmission lines has to be monitored to form the feedback signal for generator 350. The maximum operating frequency of the oscillator is depended of how much energy per cycle has to be taken of of the tank and delivered to a load. Therefore, by using low impedance transmission lines, or using parallel transmission lines the maximum operating frequency can be improved.

In case an external load has to be driven by the oscillator, an optional buffer circuit (260, 361) can be used to produce the output signal on nodes (246, 346). The buffer circuit (260, 361) decouples the signal on nodes (246, 346) from the signal on nodes (245, 345).

Figure 4A:
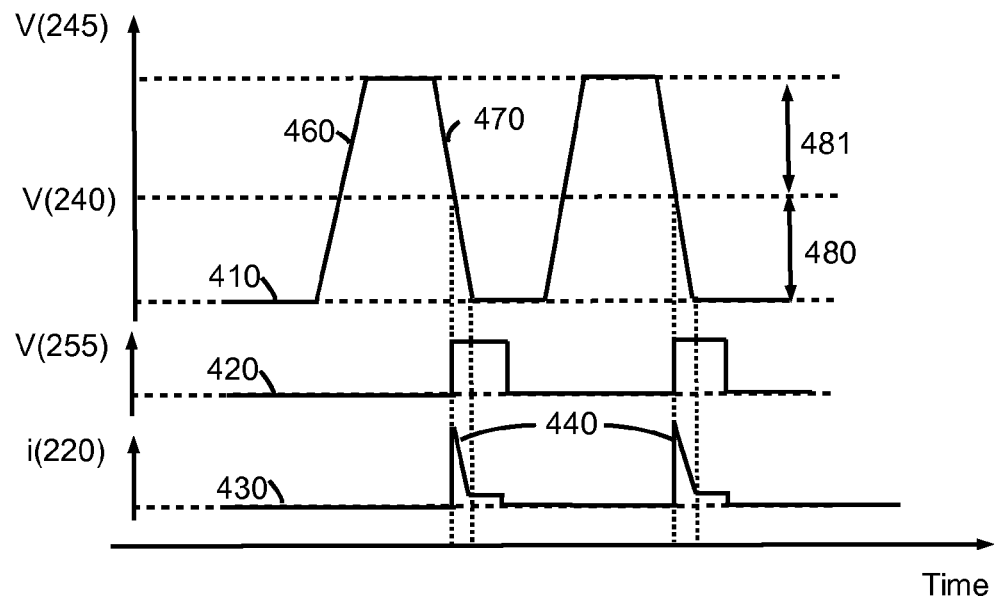
FIG. 4a is a timing diagram of a transmission line oscillator, depicting a leading wave function, according to an embodiment.

The voltage over the switching device 220 is shown in FIG. 4a waveform 410. Waveform 420 is the voltage on node 255, the activation signal for the switching device. Waveform 430 shows the current through the switching device 220. In an ideal case the current through the switching device 220 corresponds only to the tank losses. However, if the period of the tank is not equal to the period of the generator 250, an overlap current 440 will flow during the time waveform 410 and waveform 420 overlap. The amount of energy delivered to the tank in one cycle can be controlled by the on-resistance of the switching device and the pulse width of the switching signal on node 255.

The amplitude of waveform 410 is substantially twice the voltage of the voltage source 230 and the duty cycle is substantially 50%. The amplitudes 480 and 481 in FIG. 4a are substantially equal to the voltage of voltage source 230.

Starting the oscillator of FIG. 2 by pulling node 245 with a low impedance switch device to ground would cause an overshoot on node 245 after the first reflection on node 240 and an undershoot after the second reflection from node 240. An overshoot condition is reached if the voltage on node 245 is more than twice the voltage of the voltages source 230. A undershoot condition is reached if the voltage on node 245 is below zero.

The overshoot undershoot condition can be avoided by injection a starting voltage of half the voltage of the voltage source 230 onto node 245. Designing the on resistance of switching device 220 to be the same as the characteristic impedance of transmission line 210 will also avoid the overshoot, undershoot condition.

FIG. 4a depicts the situation when the period of the tank, is higher than the period of the generator 250. The activation signal 420 will arrive slightly earlier than the signal from the tank 410 and push the falling edge 470 further down and therefore advance the falling edge 470.

Figure 4B:
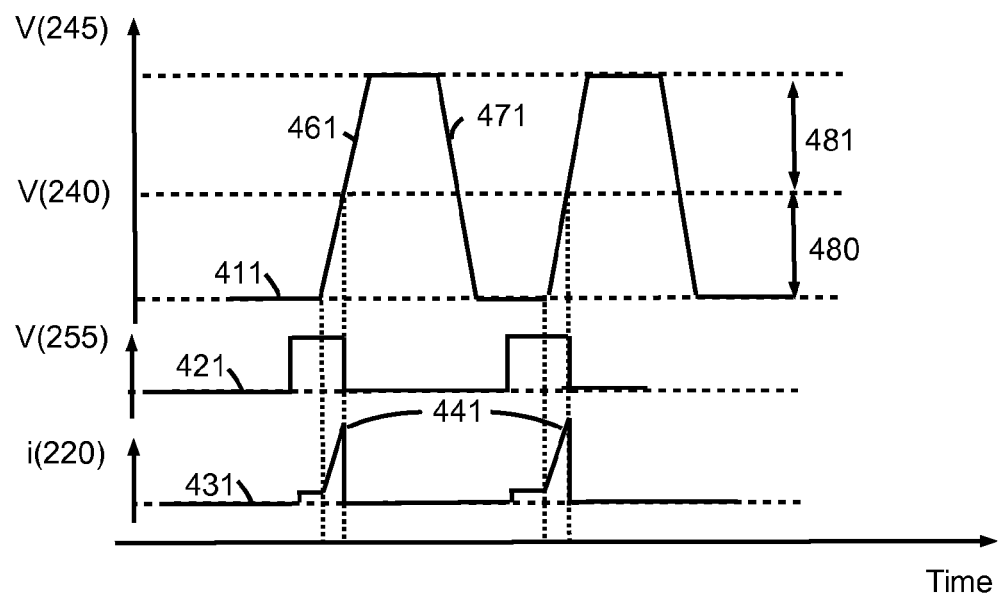
FIG. 4b is a timing diagram of the transmission line oscillator, depicting a lagging wave function, according to an embodiment.

FIG. 4b depicts the situation when the period of the tank, is lower than the period of the generator 250. The activation signal 421 will arrive slightly later than signal 411 from the tank and will hold the rising edge 461 down and therefore delaying the rising edge 461.

The overlap between the activation signals 420, 421 and the tank signals 460, 461 causes and current spikes 440, 441 in the switching device 220. Current spike 440, 410 should be as small as possible just enough to have control over the frequency of oscillation. By adjusting the timing between the activation signal 420 and the tank signal 410 and adjusting the pulse width of the activation signal, the oscillator can be operated such that current through the switching device 220 flows only when the voltage over the switching device is low. This is desirable since it reduces the stress on the switching device and reduces the power loss over the switching device.

The pulse width of the activation signal can be adjusted by the position of the tapping point on transmission lines 210. The timing between the activation signal and the tank signal can be adjusted by a delay from the tapping point to the activation signal.

Figure 8:
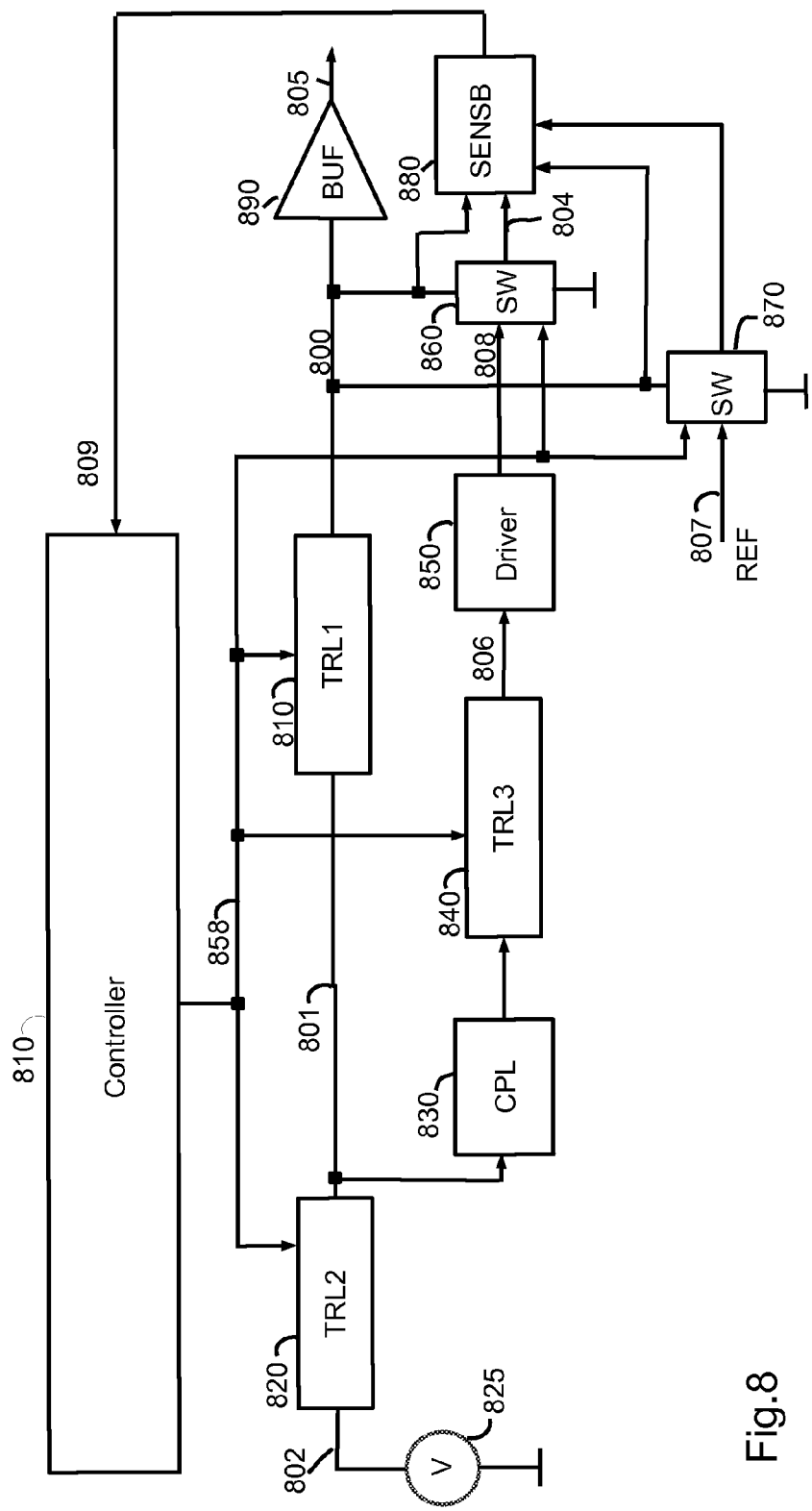
FIG. 8 is a circuit diagram depicting an injection lock oscillator, according to an embodiment.

The circuits in FIGS. 2 and 3 can also be used in an injection lock configuration, as described in more detail with respect to FIG. 8, for example. The electric length of transmission line 210, 310, . . . 360, the on resistance of the switching device 220, 320 and the pulse width of the switching signal 255, 355 can be used as design variables to set the performance parameters of the injection lock configuration.

Figure 3B:
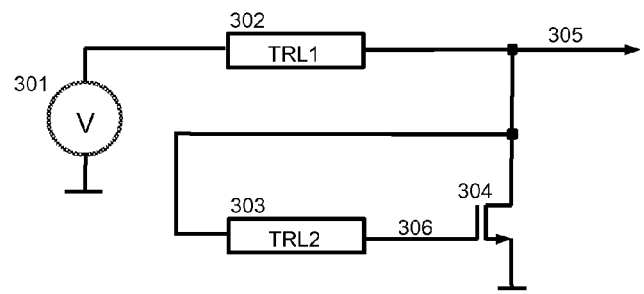
FIG. 3b is a schematic diagram of a minimal transmission line oscillator, according to an embodiment.

FIG. 3b shows the simplest embodiment of the oscillator based on the concepts of FIG. 2. The voltage source 301 is set to roughly the threshold voltage of transistor 304. If the voltage on node 306 is above the threshold voltage, transistor 304 conducts current from node 305 to ground, otherwise the transistor 304 is in a high impedance state. The delay through transmission line 302 is roughly a quarter of the period of oscillation. The delay through transmission line 303 is roughly twice the delay of transmission line 302. The impedance of transmission line 303 can be made substantially higher than the impedance of transmission line 302. Ramping up the voltage source 301 from zero volts to the threshold voltage will trigger oscillation in the circuit.

Figure 3C:
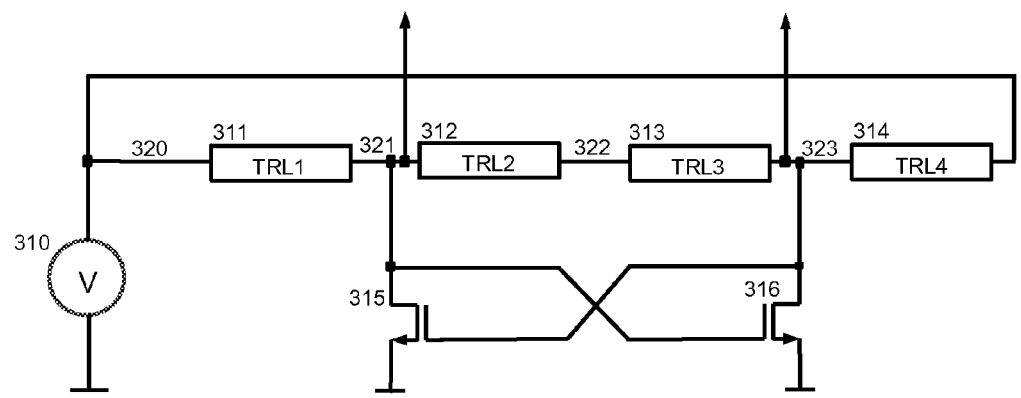
FIG. 3c is a schematic diagram of a minimal transmission line oscillator with complementary outputs, according to an embodiment.

FIG. 3c shows an embodiment of the oscillator producing complementary output signals at nodes 321 and 323. The circuit in FIG. 3c consists of two instances of the circuit of FIG. 3b. Transmission line 303 in FIG. 3b is equivalent to the transmission lines 312 and 313 in FIG. 3c. The tank circuit is formed by transmission lines 311, 312, 313, and 314. All transmission lines are substantially the same electric length. Both ends of the tank are connected to voltage source 310, unlike the tank in FIG. 3b which has one open end. The tank in FIG. 3c is excited is in the first over mode. That is, the standing wave in the tank is zero at nodes 320 and 322, and has a maximum at nodes 321 and 323. The delay for the gate signal of transistors 315 and 316 established by transmission lines 312 and 313. The transmission lines 312 and 313 can be combined into one with twice the length.

Figure 3D:
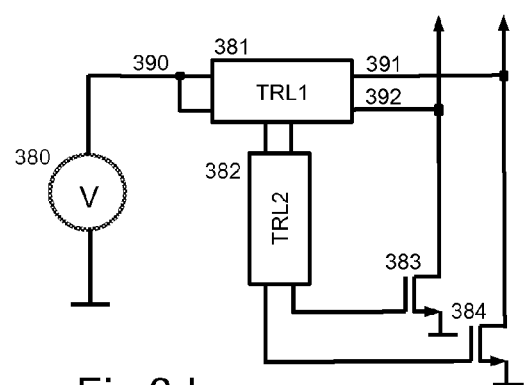
FIG. 3d is a schematic diagram of a differential implementation of the transmission line oscillator, according to an embodiment.

FIG. 3d depicts a differential implementation. Transmission lines 381 and 382 are differential transmission lines having an even mode characteristic and a differential mode characteristic. The switching devices 383 and 384 function as a differential switch. Removing the ground connection from the switching devices 383 and 384 and feeding a common current into the switching devices allows for an amplitude control of the output signal 391 and 392. In order to suppress common mode oscillation transmission lines having half the wavelength of the oscillation can be inserted at differential nodes in the circuit.

Figure 5:
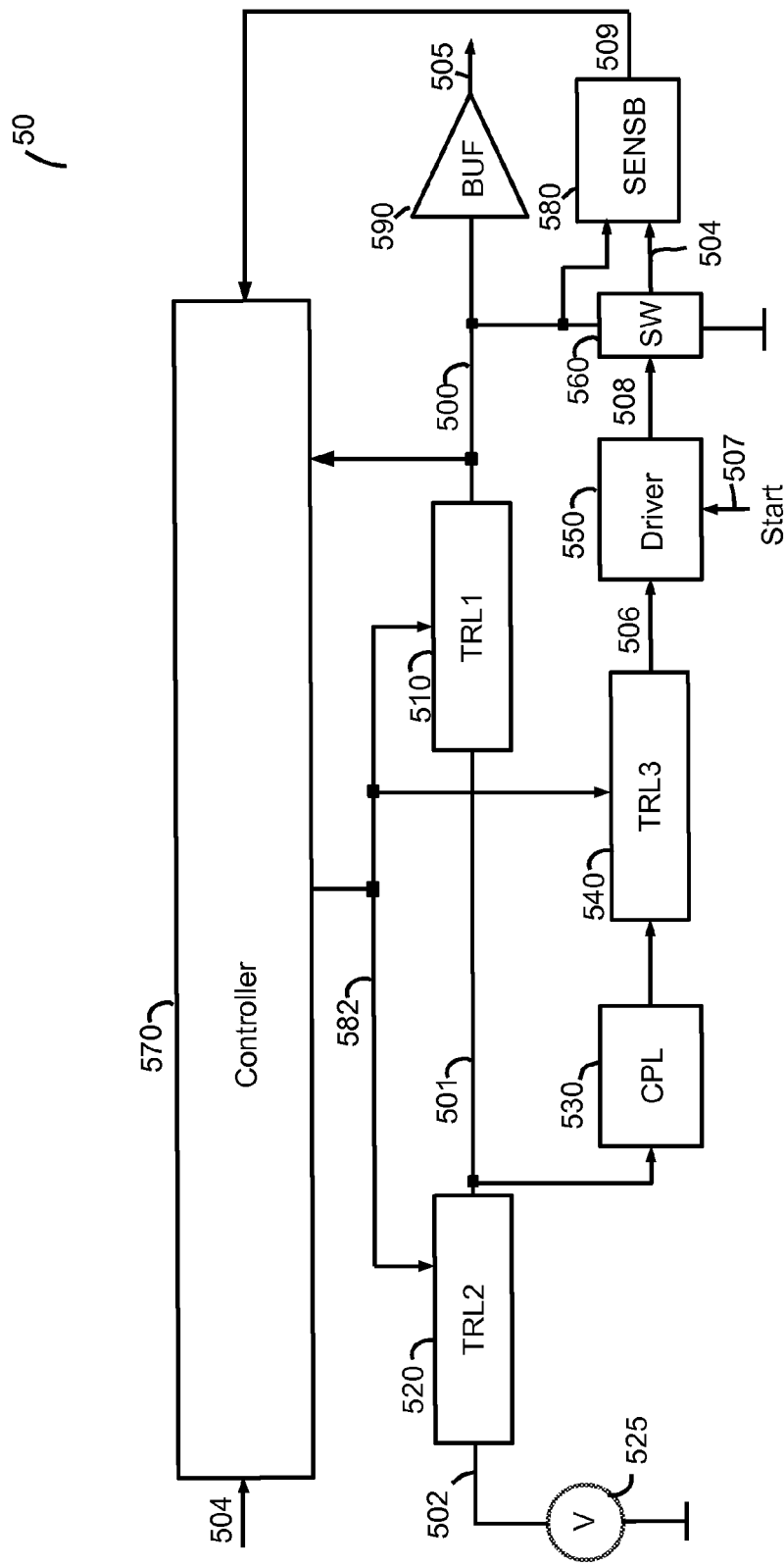
FIG. 5 is a circuit diagram of the tunable transmission line oscillator, according to an embodiment.

FIG. 5 shows an embodiment of a tunable oscillator circuit based on the concepts of FIG. 2. The transmission line 210 in FIG. 2 is split into two separate transmission lines 510 and 520. Transmission lines 510 and 520 form the tank circuit. A feedback path comprises coupling element 530, transmission line 540 and driver block 550.

The oscillation period is in first order determined by the electric length of the transmission line 510, 520 and 540.

Figure 6A:
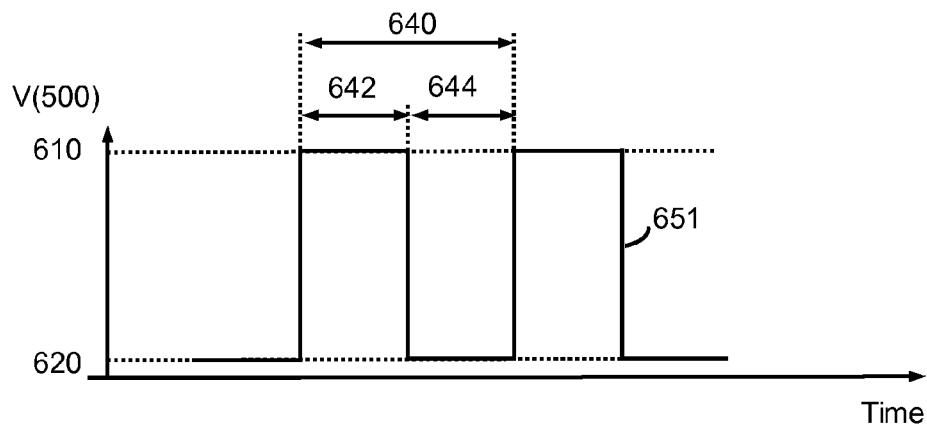
FIGS. 6a-6c are timing diagrams of waveforms on a transmission line, according to an embodiment.
Figure 6B:
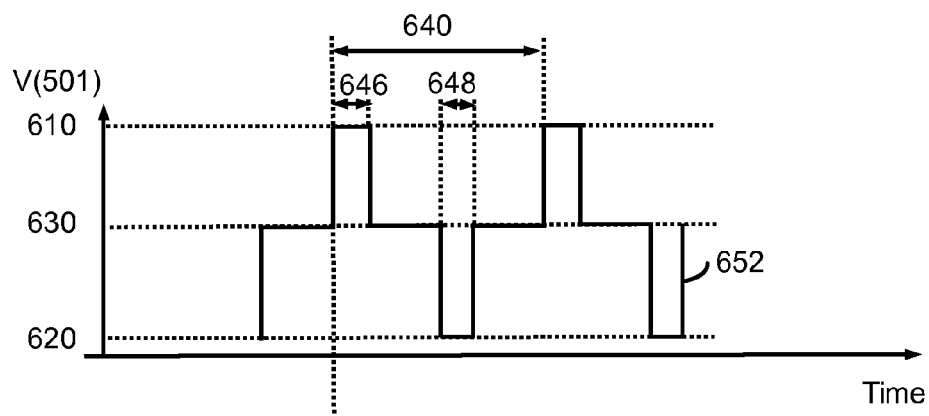
Figure 6C:
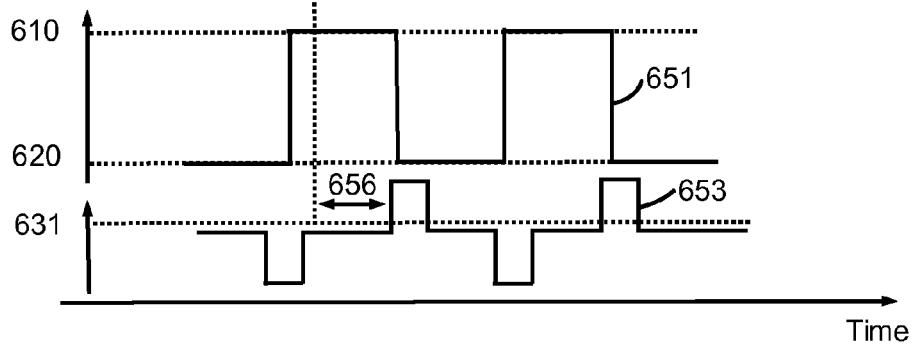

The signals on nodes 500, 501 506 are shown in FIG. 6 as waveforms 651, 652 and 653. The voltage level 630 corresponds to the level of the voltage source 525. The voltage level 610 is in first order the voltage level 630 plus the voltage of voltage source 525 and voltage level 620 is in first order the voltage level 630 minus voltage level of voltage source 525. At node 500 the high time 642 and the low time 644 are the same, half the period of oscillation 640. Changing the position of the tapping point 501 by varying the relative electric length of transmission line 510 compared to the electric length of transmission line 520 changes the high time 646 and low time 648 of waveform 652. This is due the overlay of the incident wave, from node 500, and the reflected wave from node 502.

In operation, the switching element 560 can be activated once the voltage on node 506 passes a threshold voltage 631. By choosing the tapping point 501 and the threshold voltage 631 an optimal activation pulse for the switching device can be generated. The activation pulse of waveform 653 has to be aligned with the low cycle of waveform 651. This is achieved by delaying waveform 652 with transmission line 540.

A coupling element 530 can be used to take some of the energy out of tank at the tapping point 501 to form the feedback signal 506. The coupling can be capacitive, inductive, resistive or just a wire connection. A coupled transmission line configuration formed by transmission lines 510, 520 and transmission line 540 can also be used. In this case, the coupling element 530 can be omitted.

In case the feedback signal 506 can't directly operate the switching device 560 a driver block 550 can be used to reshape the signal 506 such that it fits the requirements of the switching device 560.

A start-up signal 507 initiates a first pulse on node 500. The pulse will travel down transmission line 510 and 520. Part of the pulse will travel from node 501 back to the control terminal of the switching device 560 via 530, 540 and 550 and activate the switching device 560 and therefore maintaining the oscillation.

The driver block 550 combines the start signal 507 and the feedback signal 506. The driver block 550 can be active circuitry, passive circuitry or not implemented at all, depending on the levels required to drive the switching device 560. The start signal doesn't have to be injected in the driver block 550, it can be injected in any other suitable places in the loop. The buffer circuit 590 isolates the oscillator core circuit from the load at the output node 505.

The sensor block 580 produces a sensor signal 509 which is indicative of the state of the tank and the switching device. One possible indicator of the state of the switching device is the power consumed or the current in the switching device 560. One possible indicator of the state of tank is the timing of the signal 500 relative to signal 508. In case the power consumption of the switching device is used as indicator the temperature of the switching device could be measured to from sensor signal 509.

Figure 7:
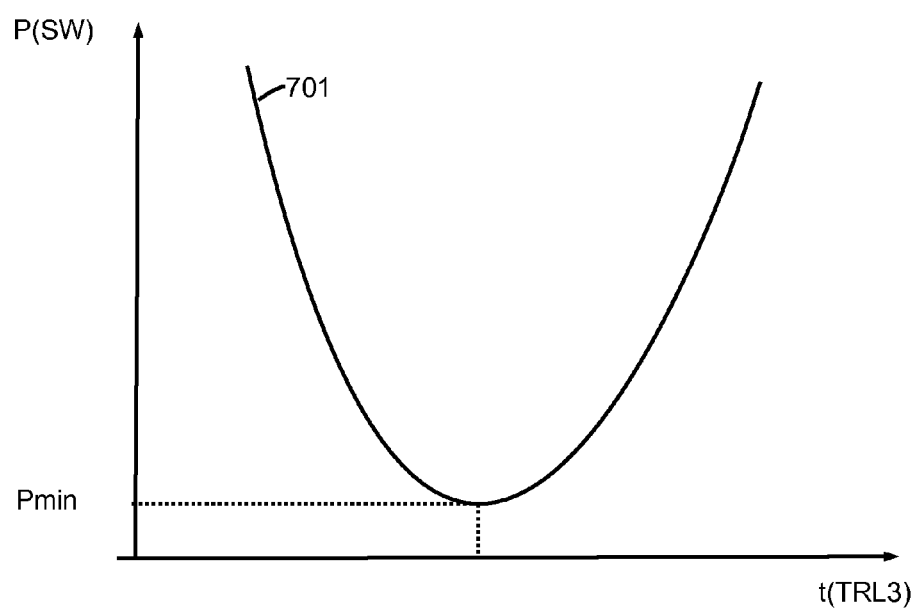
FIG. 7 is a diagram of a switching device's power dissipation, according to an embodiment.

As an example, graph 701 in FIG. 7 shows the power dissipated on the switching device depending on the electric length of transmission line 540. The power dissipation has a distinct minimum, Pmin. The controller 570 will adjust transmission line 540 such that it operates close to the minimum. A gradient descent method or similar search method can be used to find the minimum Pmin. However, in the process of adjusting for minimum power dissipation the oscillation frequency might change. In that case, the controller 570 has to compensate the frequency by adjusting either transmission line 510 or 520. The iterative procedure of optimizing for minimum power consumption and adjusting for the correct frequency of oscillation can be implemented in the controller 570.

The controller adjusts the electric length of one or more of transmission lines 510 or 520 or 540. The signals controlling the electric length of the transmission lines 582 can be analog or digital depending on the implementation of the transmission line tuning mechanism.

The circuit in FIG. 5 can be used as a controlled oscillator in a phase locked loop (PLL) configuration. In this case the controller 570 will increase or decrease the frequency of the tank until the phase of the tank is in lock with the phase of the reference signal 504.

FIG. 8 shows an embodiment of an injection lock oscillator. A reference signal 807 injects energy into the tank. The on-resistance of the switching device 860 and on-resistance of the injection switching device 870 are adjustable by the controller 810. The state of the tank and the switching device 860 and the injection switching device 870 are monitored by sensor block 880 like in the embodiment of FIG. 5.

Figure 9A:
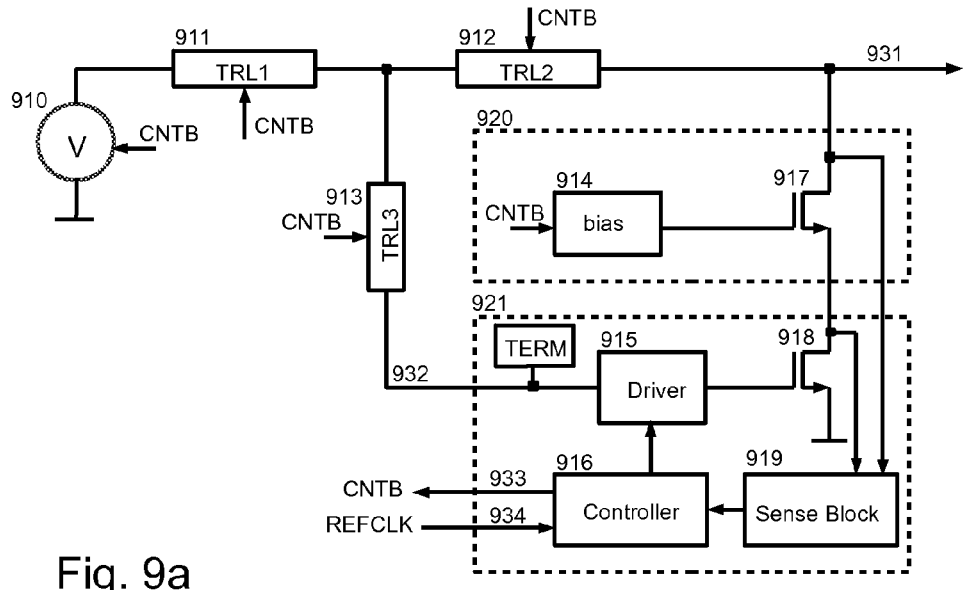
FIGS. 9a-9b depict circuit diagrams of an oscillator system, according to two embodiments.

FIG. 9a depicts an embodiment of the invention using multiple process technologies. The driver 915, controller 916, switching transistor 918 and sensor block 919 can be implemented in a process technology suitable of processing mixed analog, digital signal. CMOS technology is one such process technology. However, CMOS processes are limited in their capability to drive fast and high voltage signals. Therefore, a second process technology can be used to interface to the tank circuit. In FIG. 9a, the tank circuit consists of transmission lines 911, 912, and 913. The interface circuitry is shown in block 920. It consists of a bias block 914 and a cascode transistor 917. Suitable process technologies for block 920 would be GaN, GaAs or SiGe or any process technology which can handle high output voltages at high frequencies. The sensor block 919 monitors the output signal 931 and the current and/or the voltage over the switching transistor 918. The information of the state of the switching transistor is feed to the controller 916. Based on the state of the switching transistor the controller 916 will adjust one or more of voltage source 910, transmission lines 911, 912, 913, bias block 914 and the driver 915 via a control bus 933. In case the circuit of FIG. 9a operates as a phase locked loop (PLL) the controller takes the reference clock signal 934 in addition to the state of the switching transistor into account to adjusts the control bus 933. For fixed frequency application it is sufficient to control the delay of the driver 915 only. However if a wider tuning range of the oscillator is required, it is advantageous to adjust the parameters of the tank circuit.

Figure 9B:
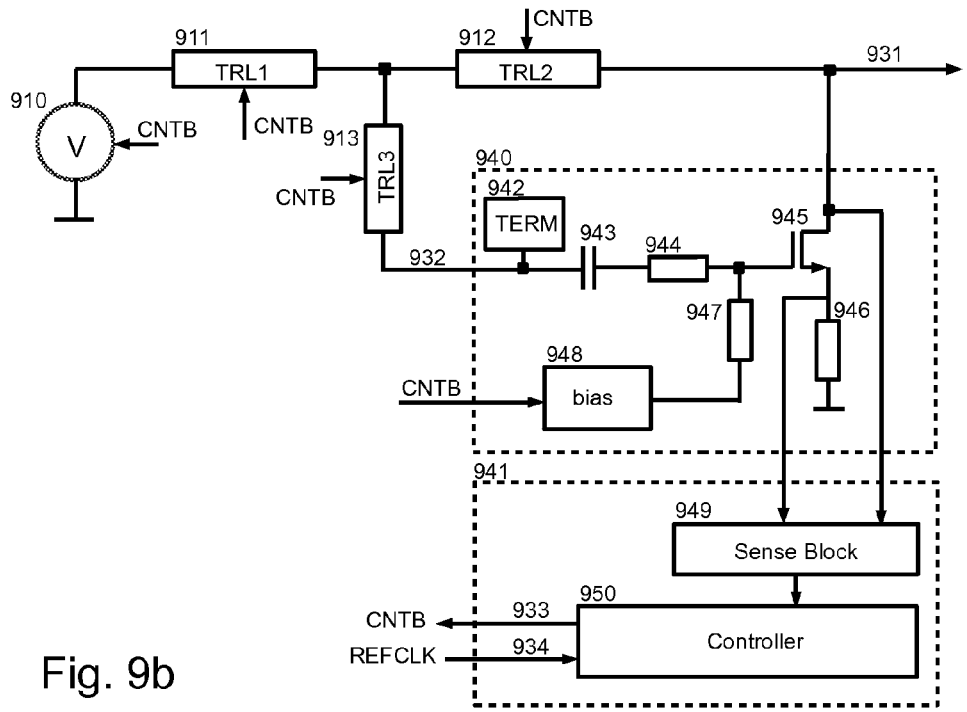

FIG. 9b depicts different embodiment of the invention using multiple process technologies. In FIG. 9b the oscillator is isolated from the circuitry in block 941. Only sensor and control signals pass between the blocks. The sensor block monitors the output signal 931 and the current through the switching transistor 945. Based on this information the power consumption of the switching device can be estimated. Based on the power estimate the controller can adjust the circuit elements via the control bus 933. Signal 932 is coupled out of the tank circuit and can be used to drive the switching transistor 945. Depending on the threshold voltage and required over-drive of the switching transistor 945, signal 932 might be scaled by the divider 944,947. To optimize the gate drive of switching transistor 945 further, a bias voltage 948 can be used. Since the rise and fall times of signals 932 are finite, the bias voltage 948 can also be used to adjust delay from signal 932 to the current in switching transistor 945 and the pulse width of the current in switching transistor 945.

Figure 9C:
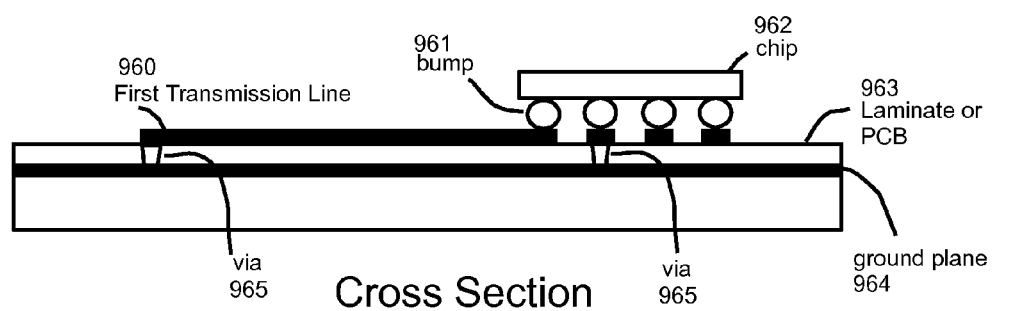
FIG. 9c is a simplified drawing of the physical implementation of an oscillator, according to an embodiment.
Figure 9C:
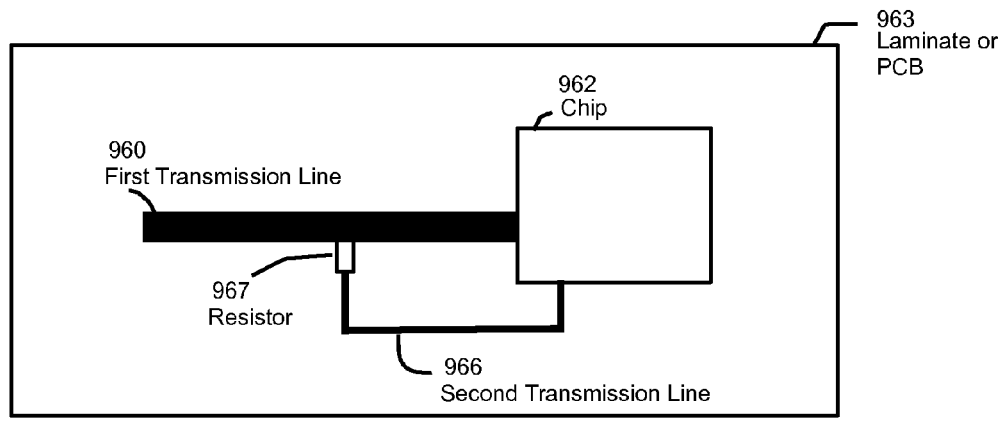

FIG. 9c shows the cross section and the top view of a physical implementation using an off-chip transmission line. The transmission lines 960 and 966 are formed between top layer of the laminate 963 and the ground plane 964. The active circuitry is integrated in chip 962. In case more than one process technologies are used, chip 962 can be implemented as a stacked die construction or the second chip can be places next to the die 962 on the laminate 963. FIG. 9c shows a flip chip implementation. The active circuit of chip 962 is facing the laminate. The connection between chip and laminate is established by bumps 961. In the example of FIG. 9c energy from the first transmission line 960 is coupled to the second transmission 966 line via resistor 967. In case a multilayer PC or laminate is available, the transmission lines 960 and 966 can be implemented in the inner layers of the PCB or laminate.

The frequency range of the oscillators starts in the GHz range and can reach hundreds of GHz, depending on the electric length of the transmission lines. The transmission lines can also be implemented on the chip 962. The area occupied by a on-chip transmission lines operating at frequencies below 10 GHz is significant and in most cases impractical. However, at higher frequencies or by using slow wave transmission lines on-chip implementations are feasible. Tuning the oscillation frequency can be achieved by applying tunable transmission lines like, Distributed MEMS transmission lines, lumped distributed transmission line, digitally controlled artificial dielectric (DiCad) transmission lines. The transmission lines can be implemented as coaxial cable, wave guide, strip line, micro strip line or coplanar wave guide.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

I claim:

1. An oscillator circuit comprising:
   a tapped transmission line (TTRL) having first and second ends and configured to route energy therebetween, wherein:
   a first terminal is directly coupled to the first end;
   a second terminal is coupled to the second end, the second terminal is not in between the first and second ends; and
   a third terminal is arranged at a portion of the tapped transmission lines between the first and second ends, wherein the third terminal includes a coupling mechanism configured to couple out at least a part of the energy that is a superposition of an energy pulse and its reflections traveling between the first and the second terminals as a control signal;
   a voltage source directly coupled to the first terminal; and
   a switching device directly coupled to the second terminal, wherein the switching device is configured to be controlled by a signal derived from the control signal.

2. The oscillator circuit according to claim 1, wherein the coupling mechanism is selected from the group consisting of
   (a) a resistive coupling mechanism,
   (b) a capacitive coupling mechanism,
   (c) an inductive coupling mechanism,
   (d) an electro magnetic coupling mechanism, or
   (e) a galvanic coupling.

3. The oscillator circuit according to claim 1, further comprising a driver coupled to the third terminal and configured to control the switching device, wherein the driver is configured to modify one or more of:
   (a) an amplitude;
   (b) an offset voltage;
   (c) a rise time or a fall time; or
   (d) a settling behavior
   of the control signal.

4. The oscillator circuit according to claim 1, further comprising:
   an output terminal; and
   a buffer circuit having an input and an output;
   wherein the input of the buffer circuit is coupled to the second terminal and the output of the buffer circuit is coupled to the output terminal.

5. The oscillator circuit according to claim 1, wherein the switching device is configured to receive a startup signal to initiate oscillation.

6. An oscillator circuit comprising:
   a first tapped transmission line (TTRL) having first and second ends and configured to route energy therebetween, wherein:
   a first terminal is directly coupled to the first end of the first TTRL;
   a second terminal is coupled to the second end of the first TTRL, the second terminal is not in between the first and second ends of the first TTRL; and
   a third terminal is arranged at a portion of the first tapped transmission line between the first and second ends of the first TTRL, wherein the third terminal includes a coupling mechanism configured to couple out at least part of the energy that is a superposition of an energy pulse and its reflections traveling between the first and the second terminals as a first control signal;
   a second tapped transmission line (TTRL) having first and second ends and configured to route energy therebetween, wherein:
   a fourth terminal is directly coupled to the first end of the second TTRL;

a fifth terminal is coupled to the second end of the second TTL, the fifth terminal is not in between the first and second ends of the second TTRL; and a sixth terminal is arranged between the first and second ends of the second TTRL, wherein the sixth terminal includes a coupling mechanism configured to couple out at least a part of the energy that is a superposition of an energy pulse and its reflections traveling between the fourth and fifth terminals as a second control signal;

a voltage source directly coupled to the first terminal and the fourth terminal;

a first switching device directly coupled to the second terminal, wherein the first switching device is configured to be controlled by a first signal derived from the second control signal;

a second switching device directly coupled to the fifth terminal, wherein the second switching device is configured to be controlled by a second signal derived from the first control signal.

7. The oscillator circuit according to claim 1, further comprising a sensor which is configured to measure one or more of:
   (a) a current through the switching device,
   (b) a power over the switching device, and/or
   (c) a time difference between a signal at the second terminal and the control signal,
wherein the sensor is configured to provide a status signal based on the measurements.

8. The oscillator circuit according to claim 7, and further comprising a controller configured to adjust at least one of:
   (a) an electric length of the TTRL between the first and the second terminals,
   (b) a delay of the control signal; and/or
   (c) a location of the third terminal,
in response to the status signal.

9. The oscillator circuit according to claim 8, wherein
the switching device is implemented in one of a CMOS, SiGe, BiCMOS, GaAs, Silicon, LDMOS, GaN, Silicon bipolar or Silicon BiCMOS process; and
the controller is implemented in one of a CMOS, SiGe, BiCMOS, GaAs, Silicon, LDMOS, GaN, Silicon bipolar and Silicon BiCMOS process and the sensor block is implemented in one of a SiGe BiCMOS, GaAs, Silicon LDMOS, GaN, Silicon bipolar or Silicon BiCMOS process.

10. The oscillator circuit according to claim 1, wherein
the switching device comprises a switching element cascaded with a cascade device; and
the switching element is implemented in one of a CMOS, SiGe, BiCMOS, GaAs, Silicon, LDMOS, GaN, Silicon bipolar and Silicon BiCMOS process; and
the cascade device is implemented in one of a CMOS, SiGe, BiCMOS, GaAs, Silicon, LDMOS, GaN, Silicon bipolar or Silicon BiCMOS process.

11. The oscillator circuit according to claim 1, wherein the voltage source is set to more than 0.2 volt and up to 80 volt.

12. The oscillator circuit according to claim 1, wherein the TTRL is implemented as at least one of a coaxial cable, a wave guide, a micro strip line, a strip line, a coplanar wave guide, a distributed MEMS transmission line, a lumped distributed transmission line and an artificial dielectric transmission line.

13. A method for generating a periodic signal comprising:
biasing a transmission line (TRL), the TRL having a first end and a second end, with a voltage source directly connected to the first end of the TRL;
controlling an impedance state of a switching device having a low impedance state and a high impedance state, wherein the switching device is electrically coupled to the second end of the TRL, but not in between the first end and the second end;
generating an energy pulse at the second end of the TRL based on the impedance state of the switching device, wherein the energy pulse is generated by controlling the switching device to change from the high impedance state to the low impedance state, and wherein the energy pulse travels from the second end of the TRL toward the first end of the TRL;
reflecting the energy pulse at the first end of the TRL, the first end being terminated by the voltage source having a low impedance, back towards the second end of the TRL;
reflecting, at the second end of the TRL, all or part of the energy pulse traveling from the first end of the TRL towards the second end of the TRL by the switching device in the high impedance state;
wherein controlling the impedance state of the switching device includes generating a control signal from a superposition of the energy pulse and its reflections traveling between the first end of the TRL and the second end of the TRL.

14. The method according to claim 13, further comprising:
generating a status signal based on at least one of the following:
   (a) a current through the switching device,
   (b) a power consumed by the switching device; and/or,
   (c) a time difference between a time of receiving a reflection of the energy pulse at the second end of the TRL and the control signal controlling the switching device.

15. The method according to claim 14, further comprising:
adjusting at least one of the following:
   (a) an electric length of the TRL;
   (b) a delay of the control signal; and
   (c) a location on the transmission line of a source of the control signal.

16. The method according to claim 13, further comprising initiating oscillation by at least one of:
   (a) changing the biasing voltage used to bias the transmission line;
   (b) adding a start signal to the control signal; and/or
   (c) coupling a pulse onto the TRL.

17. The method according to claim 13, further comprising adjusting at least one of:
   (a) an electric length of the transmission line
   (b) a delay of the control signal; and/or
   (c) a location on the transmission line of a control signal source,
to generate a desired oscillation frequency.

* * * * *